(12) United States Patent
Sundar

(10) Patent No.: US 6,327,517 B1
(45) Date of Patent: Dec. 4, 2001

(54) APPARATUS FOR ON-THE-FLY CENTER FINDING AND NOTCH ALIGNING FOR WAFER HANDLING ROBOTS

(75) Inventor: Satish Sundar, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/626,899

(22) Filed: Jul. 27, 2000

(51) Int. Cl.$^7$ .................................................. G06F 19/00
(52) U.S. Cl. .................... 700/245; 700/254; 700/258; 700/259; 700/260; 700/261; 700/262; 318/560; 318/568.21; 901/15; 901/16; 901/21; 901/39; 701/23
(58) Field of Search .................................. 700/245, 259, 700/250, 260, 261, 262, 254, 258; 318/560, 568.21; 901/15, 16, 19, 21, 39; 701/23; 414/744.5, 217, 783

(56) References Cited

U.S. PATENT DOCUMENTS

| | | |
|---|---|---|
| 4,819,167 | 4/1989 | Cheng et al. . |
| 5,483,138 | 1/1996 | Shmookler et al. ............ 318/568.16 |
| 5,563,798 | 10/1996 | Berken et al. . |
| 5,706,201 | 1/1998 | Andrews . |
| 5,822,213 | 10/1998 | Huynh . |

OTHER PUBLICATIONS

Helin et al., Micro–conveying station for assembly of micro–components, 1997, IEEE, pp. 13061311.*

Konukseven et al., Robot end–effector based sensor integration for tracking moving parts, 2000, IEEE, pp. 628–634.*

\* cited by examiner

Primary Examiner—William A. Cuchlinski, Jr.
Assistant Examiner—McDieunel Marc
(74) Attorney, Agent, or Firm—Thomason, Moser & Patterson

(57) ABSTRACT

A system and an associated method for positioning a substrate includes transferring a substrate along a path intersecting a plane of a sensor beam; determining a center point and an orientation indicator of the substrate utilizing signals from the sensor beam; and positioning a substrate according to the center point and the orientation indicator of the substrate.

10 Claims, 8 Drawing Sheets

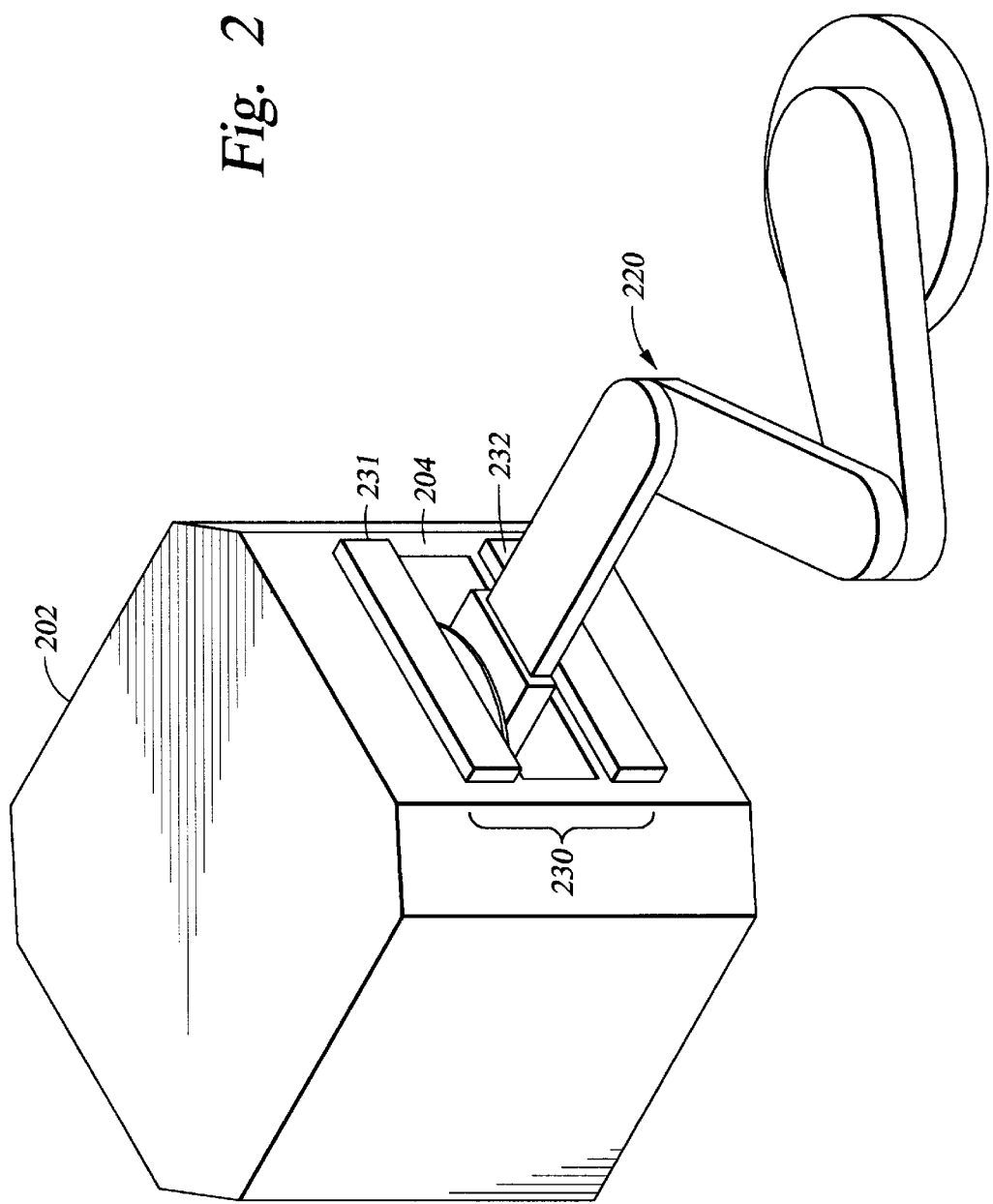

APPARATUS FOR ON-THE-FLY CENTER FINDING AND NOTCH ALIGNING FOR WAFER HANDLING ROBOTS

BACKGROUND OF THE INVENTION

1. Field of the Invention

The invention relates generally to robotic substrate handling systems. More particularly, the invention relates to an apparatus and a method for on-the-fly substrate orientation and center finding while a substrate is transferred between chambers by a robot handling system.

2. Background of the Related Art

In the manufacture of integrated circuits, semiconductor substrates are loaded into various reaction and other processing chambers using automated equipment for processing. Typically, the automated equipment includes a robot that can transfer a semiconductor substrate, such as a silicon wafer, from a cassette in a loadlock chamber through a central transfer chamber and into one or more processing chambers disposed in connection to the transfer chamber. The robot is typically disposed in a central location in the transfer chamber to provide access to all of the chambers connected to the transfer chamber. It is desirable to know the exact location and orientation of the semiconductor substrate relative to the processing chamber so that the substrate can be precisely positioned at an optimum location within the processing chamber to maximize the effectiveness of the processing onto the precise desired surface area of the substrate to be processed. Preferably, the center point and the notch or flat orientation indicator on the substrate are determined to position the substrate in alignment with the desired processing position. Likewise, it is also desirable that the substrate positioning apparatus which is used as a reference point and upon which the substrate is transported be routinely calibrated so that positioning error is minimized, if not eliminated.

One current method and system for locating the center point and the notch or flat orientation indicator of semiconductor substrates provides a "spindle" type orientation/center-finding apparatus. A substrate is transferred by a shuttle robot to a spindle in the orientation/center-finding apparatus where the substrate is incrementally rotated to determine the center and orientation of the substrate. The distances between the center of rotation to the periphery of the wafer is measured along a linear path by a sensor means, the wafer centerpoint offset is calculated by geometric analysis of the measurements, and the wafer centered on the spindle by the shuttle robot.

There are several disadvantages with the spindle type method and system. First, it is an entirely separate and distinct apparatus from the processing system. Having a separate center-finding apparatus requires an additional step in the manufacturing process, adding cost and complexity and decreasing valuable throughput time. That is, the wafer cannot be directly unloaded by robot from the wafer storage cassette and transferred to a processing chamber without first being manipulated by the separate center-finding apparatus. As a result, the spindle type system and method does not take advantage of the direct movement of the wafer as it is transferred from the wafer storage cassette to the processing chamber. In addition, the shuttle robot may require periodic calibration by a separate calibration tool if the center-finding method is to remain accurate. Furthermore, once the positioning method has been performed, the wafer is transferred to a separate wafer transport arm which may also require periodic calibration to maintain precision positioning of the wafer.

Another system for locating the centerpoint of semiconductor substrates is disclosed in Cheng et al., U.S. Pat. No. 4,819,167, entitled SYSTEM AND METHOD FOR DETECTING THE CENTER OF AN INTEGRATED CIRCUIT WAFER, issued Apr. 4, 1989, which patent is hereby incorporated by reference in its entirety and is commonly assigned to Applied Materials, Inc., of Santa Clara, Calif., the Assignee of the present invention.

In Cheng et al., the system and method disclosed is of an "optical sensor array" type whereby a semiconductor wafer is moved along a linear path across an array of sensors positioned generally transverse to the linear path of the wafer support blade. This centerfinder method is performed upon the direct removal of the wafer from a storage cassette by a processing system robot and while en route to a processing chamber. The robot blade and peripheral edges of the wafer are detected separately by the optical sensors to calculate the coordinate center position of the wafer relative to the robot blade. An x-y coordinate system is defined by the path (x) of movement of the robot arm/blade and the center line (y) of the optical sensors. The origin (0) of the y coordinate axis is defined by the position of the center sensor. The detection of the robot blade provides a reference point and origin (0,0) of the x-y coordinate system from which to move the wafer to its destination point. The detection of points along the leading and trailing edges of the wafer provide points on the x axis generally parallel to the path of movement of the wafer and from which the centerpoint of the wafer can be geometrically determined. Once the wafer center position is geometrically determined, the wafer can be moved and positioned at the destination location.

The Cheng et al. type centerfinding system overcomes the disadvantages of having a separate and distinct apparatus. The centerpoint of the wafer is determined directly during movement of the wafer to its destination location. This is especially advantageous in a wafer processing system configuration where there exists a robot of a R-Theta type in a multiple chamber processing apparatus with a single loadlock chamber as shown in Cheng et al. However, the Cheng et al type centerfinding system does not provide orientation of the substrate to align the notch or flat orientation indicator on the substrate to a particular orientation. The substrate has to be provided in an oriented position in the load lock cassette or has to be oriented in a separate orientation apparatus.

Therefore, there is a need for a combined orientation/centerfinding system that provides on-the-fly substrate orientation and center finding features as the substrate is transferred between chambers connected to a central transfer chamber.

SUMMARY OF THE INVENTION

The present invention generally provides a combined orientation/centerfinding system having on-the-fly substrate orientation and center finding features as the substrate is transferred between chambers connected to a central transfer chamber.

One aspect of the invention provides an apparatus comprising: a robot having an end effector adapted to transfer the substrate; one or more emitters disposed to emit a sensor beam in a plane intersecting a path of a substrate being transferred by the robot; one or more receivers disposed to receive the sensor beam and to generate signals to a processor; a processor adapted to process signals from the one or more receivers to determine a central point and an orientation indicator of the substrate relative to a reference point; and a controller for controlling robot movement according to the center point and the orientation indicator of the substrate. Preferably, the robot comprises a frog-leg type robot or a multi-link type robot having a rotatable gripper disposed on an end effector.

Another aspect of the invention provides a method for positioning a substrate according to the invention comprising: transferring a substrate along a path intersecting a plane of a sensor beam; determining a center point and an orientation indicator of the substrate utilizing signals from the sensor beam; and positioning a substrate according to the center point and the orientation indicator of the substrate. Preferably, the center point of the substrate is determined by minimizing an error function of a set of data points corresponding to a perimeter of the substrate, and the orientation indicator is determined by comparing a set of data points that exceeds a range of radius deviation values to a set of stored data for an orientation indicator.

The step of positioning the substrate comprises aligning the center point and the orientation indicator of the substrate with a destination position. One method of positioning the substrate comprises: rotating the substrate to a desired orientation on an end effector of a robot; rotating the robot to position the substrate for insertion into a chamber; and extending the robot to align the center point of the substrate with a destination position in the chamber. Another method of positioning the substrate comprises: rotating a robot to position the substrate for insertion into a chamber; extend the robot to align the center point of the substrate with a destination position in the chamber; lifting the substrate off the robot; positioning a rotatable robot end effector aligned with the center point of the substrate; lowering the substrate onto the rotatable robot end effector; and rotating the substrate to a desired orientation.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 2 is a perspective view of a load lock chamber and a transfer robot according to the invention.

DETAILED DESCRIPTION OF THE PREFERRED EMBODIMENT

Figure 1:
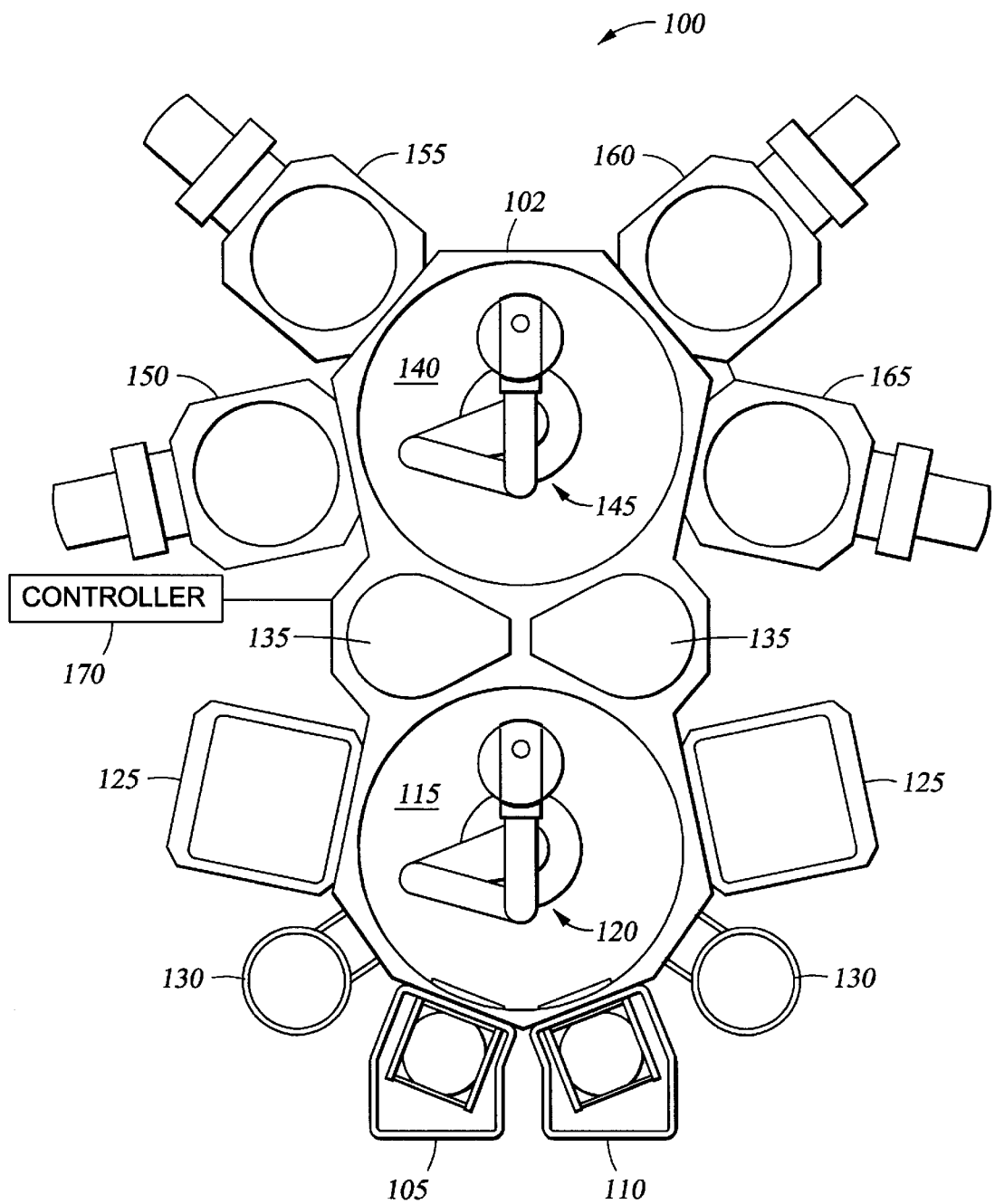
FIG. 1 is a schematic view of a processing system incorporating a substrate orientation/center-finding apparatus according to the present invention.

FIG. 1 is a schematic view of a processing system incorporating a substrate orientation/center-finding apparatus according to the present invention. The processing system 100 is a two-staged vacuum processing system defined by a mainframe or platform 102 having a plurality of modules or chamber attached thereto. An example of a commercial embodiment of a two-staged vacuum processing platform is the Endura® platform, available from Applied Materials, Inc., Santa Clara, Calif., which is described in U.S. Pat. No. 5,186,718, Tepman et al., hereby incorporated by reference in its entirety.

The processing system 100 includes vacuum load-lock chambers 105 and 110 attached to a first stage transfer chamber 115. The load-lock chambers 105 and 110 maintain vacuum conditions within the first stage transfer chamber 115 while substrates enter and exit the processing system 100. A first robot 120 transfers substrates between the load-lock chambers 105 and 110 and one or more substrate processing chambers 125 and 130 attached to the first stage transfer chamber 115. Processing chambers 125 and 130 can be configured to perform a number of substrate processing operations, such as chemical vapor deposition (CVD), physical vapor deposition (PVD), etch, pre-clean, degas, orientation and other substrate processes. The first robot 120 also transfers substrates to/from one or more transfer chambers 135 disposed between the first stage transfer chamber 115 and a second stage transfer chamber 140.

The transfer chambers 135 are used to maintain ultrahigh vacuum conditions in the second stage transfer chamber 140 while allowing substrates to be transferred between the first stage transfer chamber 115 and the second stage transfer chamber 140. A second robot 145 transfers substrates between the transfer chambers 135 and a plurality of substrate processing chambers 150, 155, 160 and 165. Similar to processing chambers 125 and 130, each of the processing chambers 150 to 165 can be configured to perform a variety of substrate processing operations. For example, the processing chamber 150 may be a CVD chamber configured to deposit a dielectric film; the processing chamber 155 may be an etch chamber configured to etch apertures or openings in a dielectric film for forming interconnect features; the processing chamber 160 may be a PVD chamber configured to deposit a barrier film; and the processing chamber 165 may be a PVD chamber configured to deposit a metal film. A plurality of processing systems may be required to perform all of the processes required to complete manufacturing of an integrated circuit or chip.

A controller 170 may control the overall operation of the processing system 100 and the individual processes performed in each of the substrate processing chambers. The controller 170 may include a microprocessor or computer (not shown) and a computer program executed by a microprocessor or computer. Substrates are brought to vacuum load-lock chambers 105 and 110 by a conveyor belt or robot system (not shown) controlled by the controller. The robots 120 and 145 are also operated by the controller to transfer substrates between the various processing chambers of the processing system 100. Additionally, the controller 170 may control and/or coordinate with other components or systems connected to the processing system 100. Although the invention is described in application in a staged vacuum processing system, the inventors contemplate applications of the invention in various substrate processing systems requiring substrate center finding and orientation. Examples of processing systems include the Centura®, Endura®, Producer® and P5000® systems available from Applied Materials, Inc., Santa Clara, Calif.

FIG. 2 is a perspective view of a load lock chamber 210 and a transfer robot 220 according to the invention. The load lock chamber 210 (e.g., one of load lock chambers 105, 110)

is connected to a transfer chamber (e.g., first stage transfer chamber 115) through openings 202 that are selectively opened and closed by slit valves (not shown). Substrates are typically stored in a wafer cassette which is loaded into the load lock chamber 202 to facilitate introduction of substrates into the processing system. The wafer cassette is typically indexed by a stepper motor connected through a lower portion of the load lock chamber to provide access of individual substrates in the wafer cassette by the transfer robot. The transfer robot 220 (e.g., first robot 120) is disposed centrally in the transfer chamber to provide substrate transfers between the different chambers attached to the transfer chamber.

One embodiment of the transfer robot is a three-joint robot as illustrated in FIGS. 1 and 2. Each joint of the transfer robot is controlled by a motor housed at the base of the robot. Each joint is connected to its controlling motor through a belt or other linked mechanism. Preferably, the three motors are independently controlled to position the three linkages at $\theta_1$, $\theta_2$, and $\theta_3$, respectively. The robot is typically controlled by a set of programmed kinematic equations that define the number of motor steps required for each motor to position the three linkages at desired $\theta_1$, $\theta_2$, and $\theta_3$, respectively. The programmed kinematic equations are typically stored in a data memory storage connected to a microprocessor that provides the signals to move the robot to particular positions. The processor can also calculate the joint positions ($\theta_1$, $\theta_2$) of the first and second linkages using the inverse kinematic equations of the robot. For a given position (i.e., x-y coordinates) and orientation ($\theta_3$) of the rotational axis of the third linkage, the joint positions ($\theta_1$, $\theta_2$) of the first and second linkages can be computed using the inverse kinematic equations of the robot. The robot is preferably calibrated to perform the substrate transfer functions required between various chambers in the processing system. Various robot calibration techniques are known in the art and can be used to calibrate robots.

A sensor assembly 230 is disposed at a position that intersects a path of the substrate as the substrate is transferred out of the load lock chamber. In one embodiment, the sensor assembly 230 comprises an emitter 231 and a receiver 232 and is attached to an interior surface of the transfer chamber adjacent the opening 204 at a position that avoids interference from the slit valve and the associated slit valve assembly components associated with the opening and closing the opening 204. The emitter 231 may be disposed at a position above the opening 204 while a corresponding receiver 232 is disposed at a position below the opening 204 that is opposite of the position of the emitter 231. The emitter 231 may project a plane of light intersecting the path of the substrate during substrate transfers. Alternatively, the emitter may comprise an array of individual emitters disposed above the opening 204 to project a plane of light intersecting the path of the substrate during transfers. The receiver 232 may comprise a single receiver or an array of receivers disposed below the opening 204 to detect signals emitted by the emitters. In the alternative embodiment having arrays of emitters and receivers, the plurality of emitters may overlap each other, and the plurality of receivers may overlap each other to ensure complete coverage of the path of the substrate during transfers into or out of the chamber. In one embodiment, the emitter 231 is a wide laser emitter that emits light which intersects the entire wafer profile even when the wafer is completely misaligned during a substrate transfer.

As the substrate is transferred out of the load lock chamber, a portion of the robot arm and the substrate block a portion of the plane of light emitted from the emitter 231. The receiver 232 detects the light emitted by the emitter 231 and provides signals corresponding to the portion blocked by the substrate and the robot arm during substrate transfer. The receiver 232 provides these signals to a processor (e.g., controller 170), and the processor determines the shape of the substrate from these signals. In one embodiment, the sensor 230 provides signals similar to data of a scanned image from which the processor may determine an outline of the substrate.

The shape of the substrate is determined by correlating the portion of blocked light to the movement of the substrate with respect to a reference point of the system. In one embodiment, the reference point is an initial default location of the robot. Alternatively, other reference points, such as the center of the transfer chamber, can be used effectively to map the relative location of the substrate.

After the robot has fully retracted the substrate out of the cassette and the substrate has been scanned by the sensors, a plurality of points, $(x_1, y_1)$ to $(x_n, y_n)$, corresponding to the perimeter of the substrate is generated by the processor. The center (a, b) of the substrate and the radius r of the substrate are then determined from these data points by minimizing an error function with respect to a, b, and r, respectively. The error function is defined by the following equation:

$$E(a, b, r) = [(x_1 - a)^2 + (y_1 - b)^2 - r^2]^2 + \quad \text{Equation (1)}$$
$$[(x_2 - a)^2 + (y_2 - b)^2 - r^2]^2 + \ldots +$$
$$[(x_n - a)^2 + (y_n - b)^2 - r^2]^2$$
$$= \sum [(x_i - a)^2 + (y_i - b)^2 - r^2]^2 \quad \text{where } i = 1 \text{ to } n$$

The values of a, b and r are determined by minimizing the error according to the following equations:

$$\delta E / \delta a = 0 \quad \text{Equation (2)}$$
$$\delta E / \delta b = 0 \quad \text{Equation (3)}$$
$$\delta E / \delta r = 0 \quad \text{Equation (4)}$$

The above equations are preferably performed using points that are within a pre-selected range which eliminates the "bad points" such as the points representing the wafer notch or wafer flat and the points representing the robot blade. The "bad points" $(x_j, y_j)$ can be eliminated by the following equation:

$$[(X_1-a)^2+(y_1-b)^2-r^2]^2 \geq \alpha_{max} \quad \text{Equation (5)}$$

where $\alpha_{max}$ is a pre-selected number equal to the square of the maximum expected deviation of the substrate radius. For example, for 200 mm substrates where the deviation in the substrate radius is typically less than 0.5 mm, $\alpha_{max}$ is selected as 0.25 mm² (i.e., 0.5 mm×0.5 mm). Thus, a detected point that is outside of this pre-selected range is not used as part of the determination of the center point of the substrate.

The "bad points" are used to determine the location of the wafer notch or wafer flat. Preferably, information regarding the size of the wafer notch or wafer flat is entered into the processor/computer, and the computer compares the set of bad points to determine whether a number of these bad points correspond to a wafer notch or a wafer flat. Typically, a group of consecutive bad points indicate the wafer notch or wafer flat. The processor compares the group of consecutive bad points to the stored data for the orientation indicator to determine However, when the computer/processor is unable to detect a wafer notch or a wafer flat because the wafer notch or the wafer flat is positioned above the robot blade such that the sensor and receiver are unable to distinguish between the wafer and the robot blade, the wafer is rotated to position the wafer notch or wafer flat away from the robot blade and then the wafer is passed through the sensors again. The wafer is preferably rotated by a rotatable gripper/chuck disposed on the end effector of the robot. The minimum angular displacement (i.e., degrees) of the rotatable gripper/chuck required to ensure that the wafer notch or wafer flat is not obstructed from detection due to the wafer blade depends on the width of the wafer blade in relation to the size of the substrate. Typically, a 45 degree angular displacement ensures that the wafer notch/flat is moved to a detectable position that is unobstructed by the robot blade. However, the angular displacement may be selected as less than 45 degrees as long as the angular displacement sufficiently rotates the substrate to position the wafer notch in a detectable or unobstructed position. After the substrate has been rotated, the robot blade extends fully and retracts again to facilitate a new scan of the substrate to determine the substrate shape. The center and the wafer notch is then calculated as described above.

Figure 5:
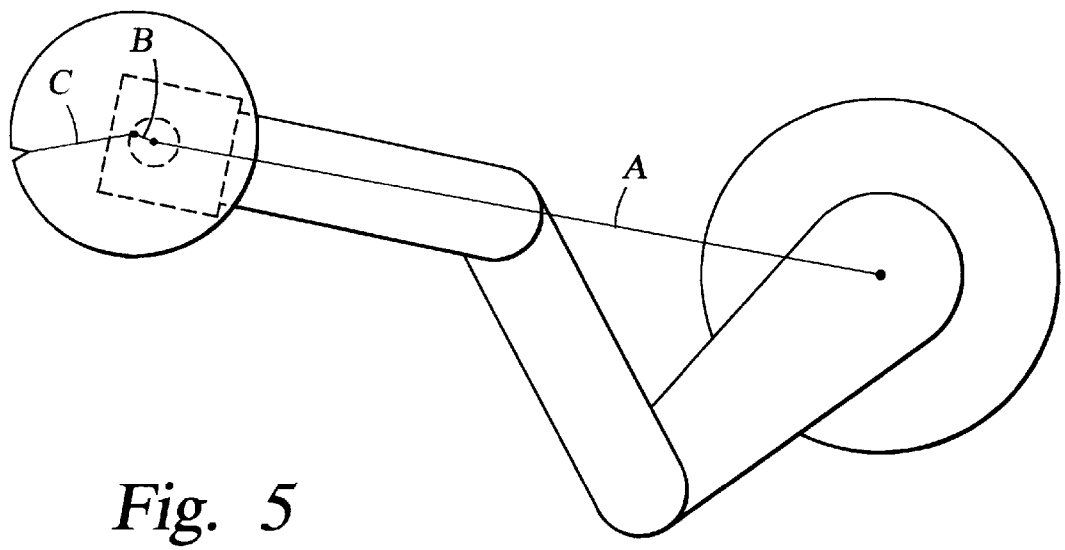
FIGS. 5 and 6 illustrate calculation of vectors.
Figure 6:
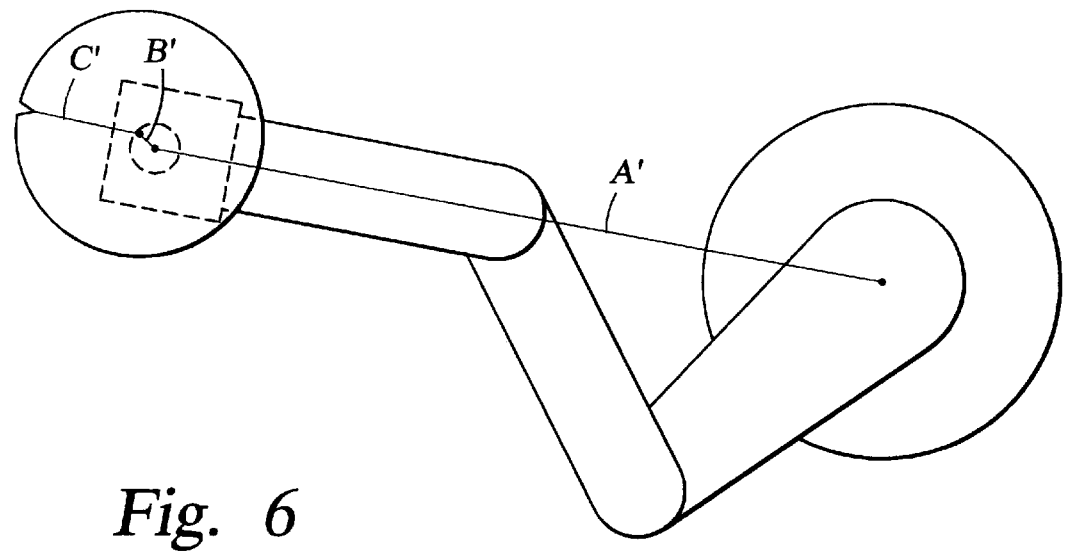

Once the center point (a, b) and the position of the orientation indicator of the substrate have been determined, the vectors A, B and C, as shown in FIG. 5 can be calculated. The vector A represents the vector from a central point of the robot to the center of the gripper. The vector B represents the vector from the center of the gripper on the robot to the center point (a, b) of the substrate. The vector C represents the vector from the center point (a, b) of the substrate to the orientation indicator. The processor determines the necessary movement of the robot utilizing inverse kinematic equations to position the substrate into the next processing chamber with the substrate aligned to the correct center position and orientation, as shown in FIG. 6, with vectors A', B' and C'. The robot can then position the substrate into the next processing chamber with the substrate aligned to the correct center position and orientation.

Figure 3A:
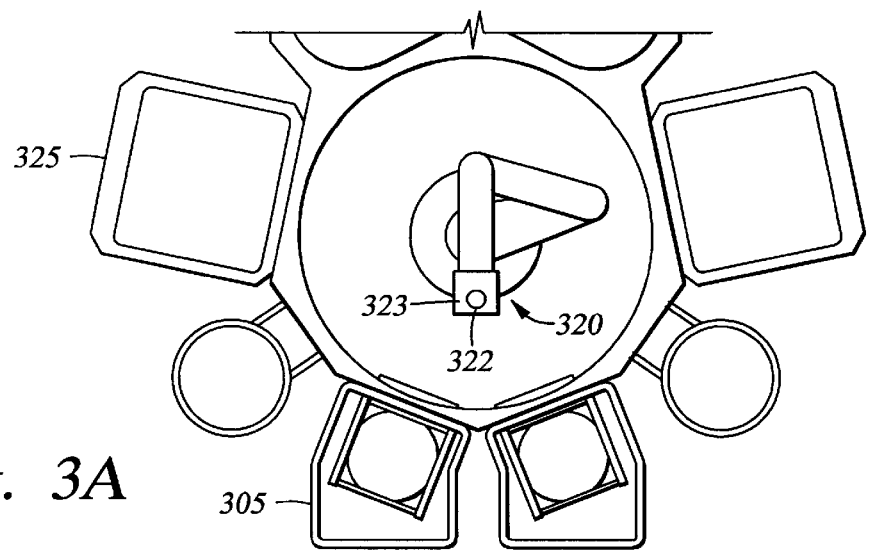
FIGS. 3A–3F illustrate one embodiment of a substrate transfer utilizing a three-arm robot according to the invention.
Figure 3B:
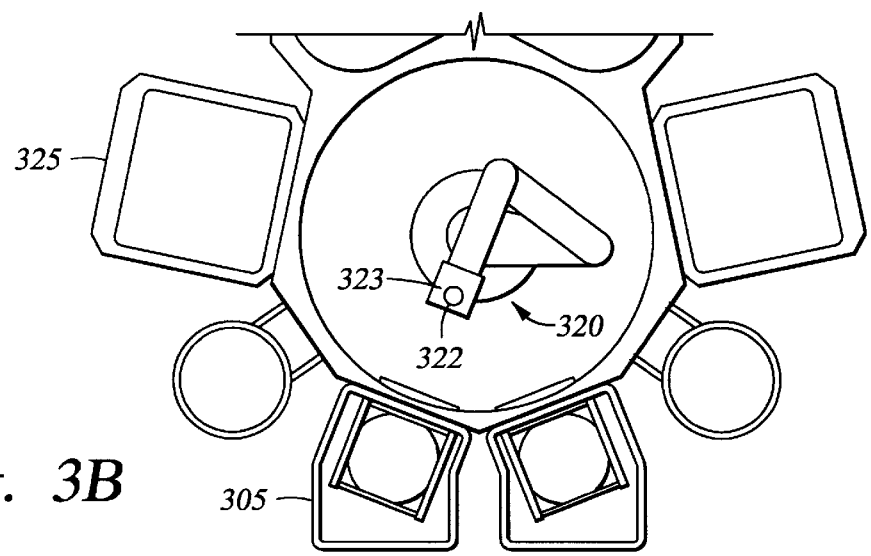

FIGS. 3A–3F illustrate one embodiment of a substrate transfer utilizing a three-arm robot according to the invention. The following description illustrates a typical substrate transfer from a load lock chamber 305 to a processing chamber 325 using a three-arm robot 320 having a rotatable gripper 322, such as a rotatable vacuum gripper, as the end effector 323. It is understood that the invention is applicable to substrate transfers between various chambers of the system. Generally, the robot 320 starts from an initial position ($\theta_{1a}$, $\theta_{2a}$, $\theta_{3a}$) where the robot 320 is fully retracted and has not rotated from the reference direction, as shown in FIG. 3A. The robot 320 then rotates to position ($\theta_{1b}$, ($\theta_{2a}$, $\theta_{3a}$), as shown in FIG. 3B, to align the robot end effector 323 in position to extend into the load lock chamber 305.

Figure 3C:
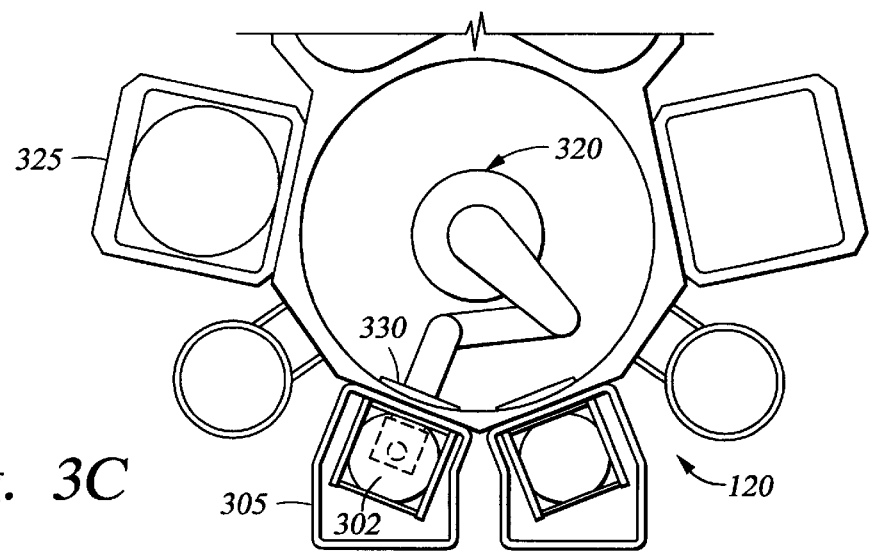
Figure 3D:
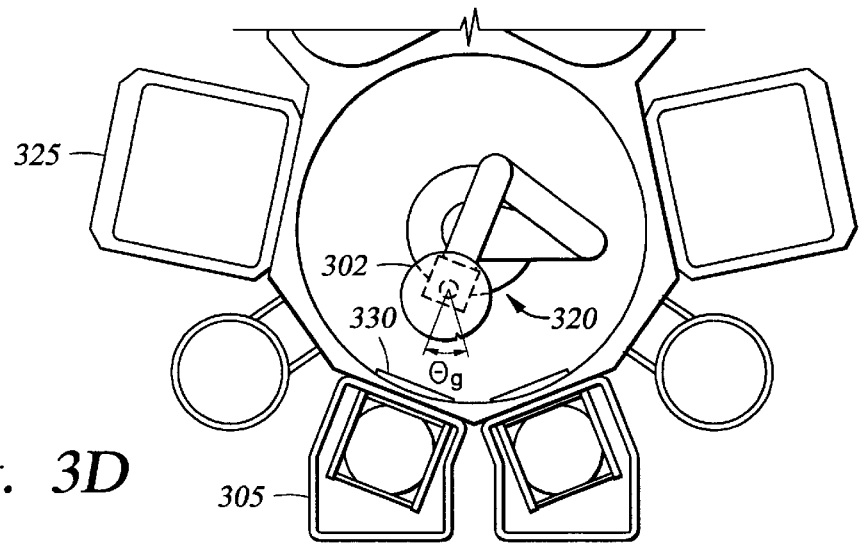

The robot 320 then extends to position ($\theta_{1c}$, $\theta_{2c}$, $\theta_{3c}$), as shown in FIG. 3C, that positions the rotatable gripper 322 below a central portion of a substrate 302 in a wafer cassette 306 which ensures that the rotatable gripper 322 is able to securely grip the substrate 302 during transfers. Alternatively, the robot 320 may extend to position the center of the rotatable gripper 322 in a position corresponding to the center of an ideally aligned substrate in the wafer cassette. Typically, the wafer cassette 306 is indexed to place the substrate 302 onto the rotatable gripper 322. Alternatively, the robot 320 is raised to lift the substrate 302 from a slot in the wafer cassette 306. A gripping mechanism, such as a vacuum mechanism, of the gripper 322 is then activated to secure the substrate 302 thereon during the transfer. The robot 320 then retracts out of the load lock chamber 305 to position ($\theta_{1b}$, $\theta_{2a}$, $\theta_{3a}$), as shown in FIG. 3D, with the substrate 302 secured on the gripper 322.

As the robot 322 retracts, a sensor 330 (e.g., emitter and receiver), disposed adjacent the slit opening on the chamber, detects the outline of the substrate 302 and transmit signals to the processor/controller. The processor/controller receives the signals and calculates the position of the substrate 302, including the center point and the orientation indicator, in relation to a reference point of the system. In one embodiment, the initial position ($\theta_{1a}$, $\theta_{2a}$, $\theta_{3a}$) is selected as the reference point to simplify calculations for transfer between various chambers. Alternatively, the reference point is selected as the fully retracted position of the robot before (or after) the substrate has been transferred out of a chamber, for example in this case, ($\theta_{1b}$, $\theta_{2a}$, $\theta_{3a}$). As a further alternative, the central point of the robot 320, which may correspond to an origin point (0,0) may be selected as the reference point.

After the substrate 302 has been retracted out of the load lock chamber 305, the processor calculates the position of the substrate 302, and the position of the center point and the orientation indicator, are known with respect to the reference point. The vectors A, B, and C, as shown in FIG. 5, and vectors A', B', and C', as shown in FIG. 6, are also calculated, and then the processor/controller calculates the robot movements required to position the substrate with the substrate center and the orientation indicator aligned in the desired position. The calculation of the robot movements is performed using the inverse kinematic equations method described above.

In one embodiment, the robot 320 rotates the substrate 302 to the desired orientation as the substrate 302 is transferred to the process chamber 325, and the robot movement compensates for the change in the center point position due to rotation of the gripper 322 on the robot 320. As shown in FIG. 3D, the rotatable gripper 322 rotates the substrate 302 $\theta_g$ degrees corresponding to the angular change required to position orientation indicator on the substrate 302 in the desired orientation. Because the position of the center point of the substrate 302 changes after the substrate 302 is rotated by the rotatable gripper (unless the center point of the gripper is aligned with the center point of the substrate), the movement of the robot 320 is compensated accordingly to ensure that the center point will be aligned to the desired center point location in the process chamber 325.

Figure 3E:
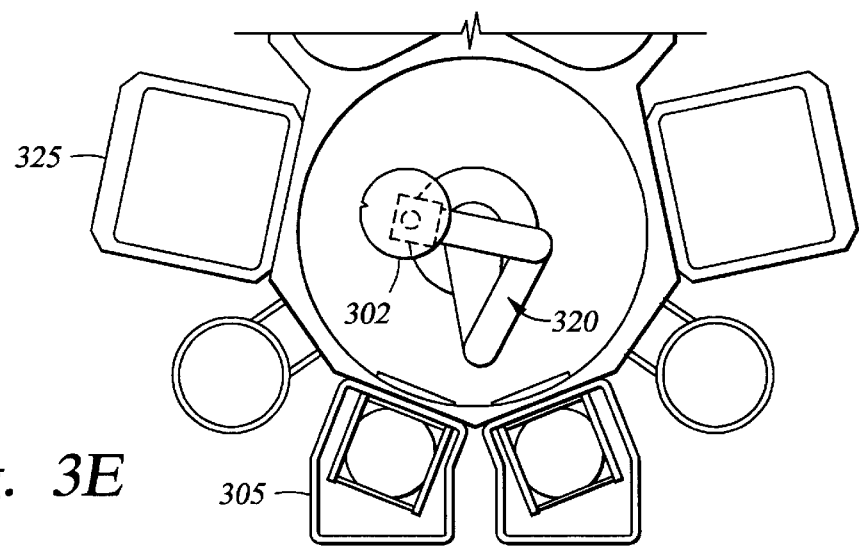
Figure 3F:
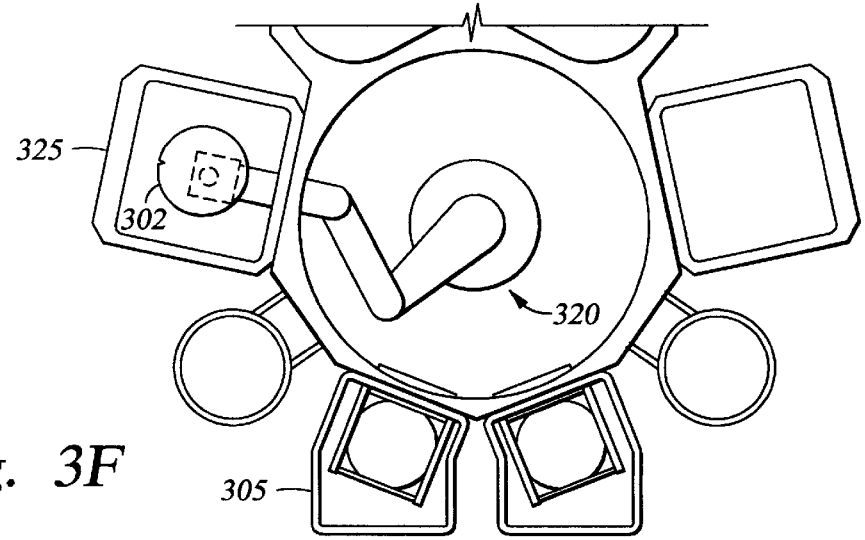

The robot 320 then rotates to position ($\theta_{1d}$, $\theta_{2a}$, $\theta_{3a}$), as shown in FIG. 3E, where the robot 320 is in position to insert the substrate into the processing chamber 325. The robot 320 then extends to position ($\theta_{1d}$, $\theta_{2d}$, $\theta_{3d}$), as shown in FIG. 3F, to position the substrate 302 centered and correctly oriented in the process chamber 325. At this destination position, the vacuum mechanism of the gripper 322 is deactivated, and the substrate 302 may be lifted off the robot end effector 323 by a wafer lift system in the process chamber 325. The robot 320 retracts fully out of the processing chamber to position ($\theta_{1d}$, $\theta_{2a}$, $\theta_{3a}$), which is the same position as the robot shown in FIG. 3E, and the substrate 302 is ready to be placed onto a substrate support and be processed in the process chamber 325. The robot 320 can be rotated to another position to begin another sequence of substrate transfer.

As an alternative embodiment of the substrate transfer sequence utilizing a three-arm robot having a rotatable gripper as the end effector, the robot 320 first positions the substrate 302 centrally aligned in the destination position and then orients the substrate 302 to the desired orientation.

The transfer sequence is the similar to the above method for calculating the position of the substrate, including the center point and the orientation indicator of the substrate 302. However, in this embodiment, after the robot retracts fully with a substrate from the first chamber (e.g., load lock chamber), the robot 320 moves from the fully retracted position ($\theta_{1b}$, $\theta_{2a}$, $\theta_{3a}$) to ($\theta_{1f}$, $\theta_{2f}$, $\theta_{3f}$) where the substrate 302 centered at the destination position in the processing chamber. The substrate 302 is then lifted off the robot end effector 323 by the wafer lift system in the chamber, and the robot 320 moves to align the center of the rotatable gripper 322 with the center point of the substrate 302. The movement is equivalent to vector B as shown in FIG. 5. The substrate 302 is then lowered onto the rotatable gripper 322, which then rotates the substrate to position the substrate in the correct orientation. The vacuum mechanism of the gripper 322 is deactivated, and the substrate 302 is lifted off the robot end effector 323. The robot 320 then retracts fully out of the processing chamber 325 and begins another sequence of substrate transfer.

Figure 4A:
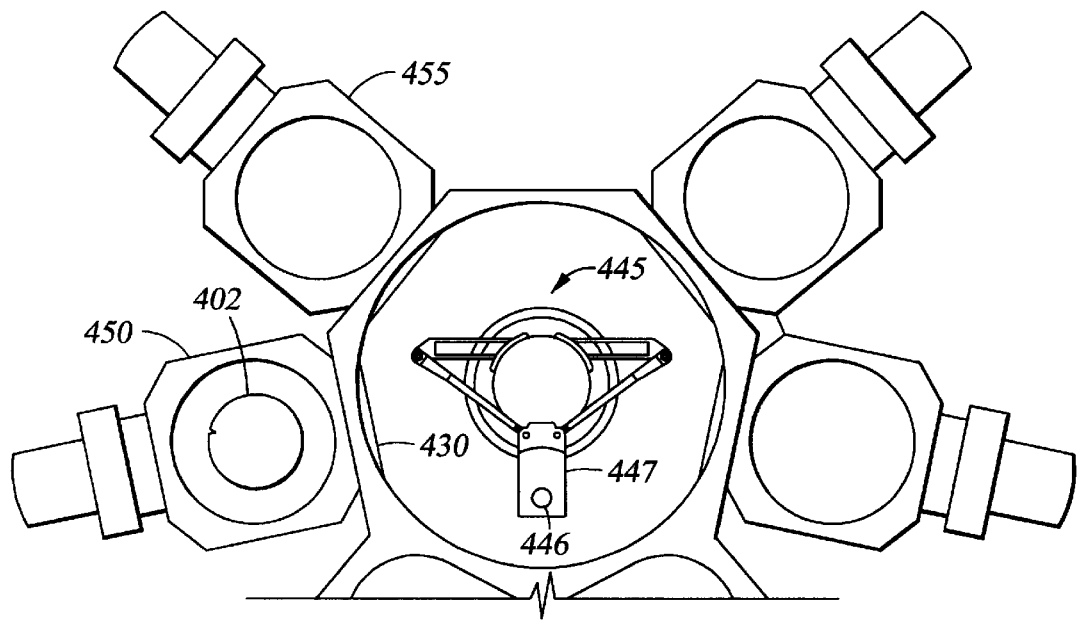
FIGS. 4A–4F illustrate one embodiment of a substrate transfer utilizing a frog-leg robot according to the invention.
Figure 4B:
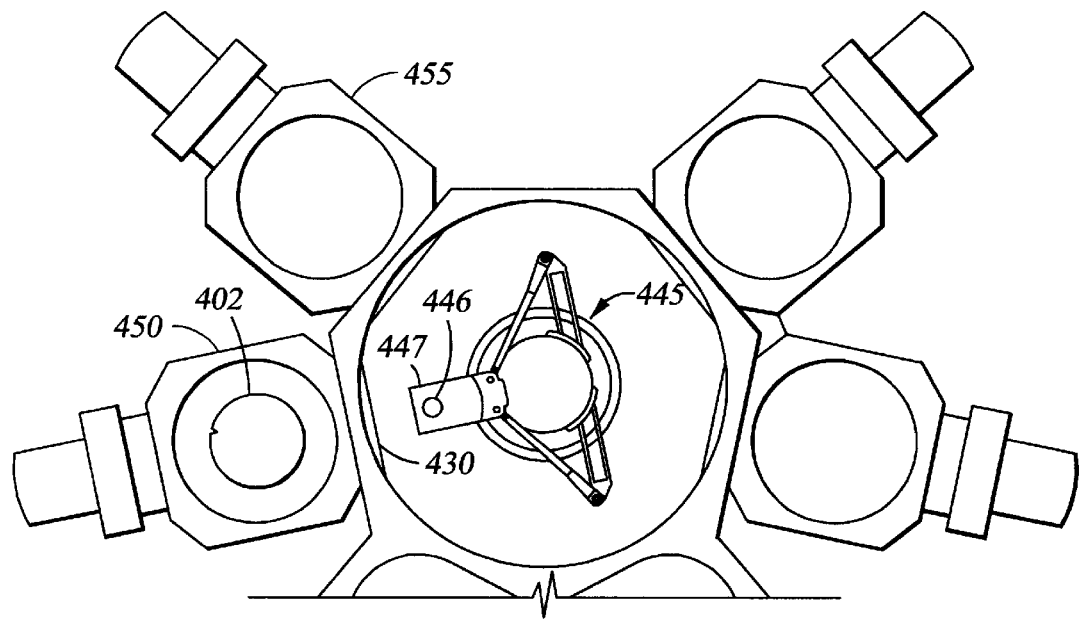

FIGS. 4A–4F illustrates a substrate transfer utilizing a frog-leg robot according to the invention. The following description illustrates a typical substrate transfer from a first processing chamber 450 to a second processing chamber 455 using a frog-leg type robot 445 having a rotatable gripper 446 as the end effector 447. The robot 445 starts from an initial/reference position of ($r_0$, $\theta_0$), as shown in FIG. 4A, where the robot 445 is fully retracted and has not rotated from a reference direction. The robot 445 then rotates $\theta_1$ degrees to position ($r_0$, $\theta_1$), as shown in FIG. 4B, to align the robot end effector 447 centrally in the direction of the first processing chamber 450. The rotation of $\theta_1$ degrees is calibrated to the radial axis corresponding to the axis through the center of an aligned substrate in the first processing chamber 450.

Figure 4C:
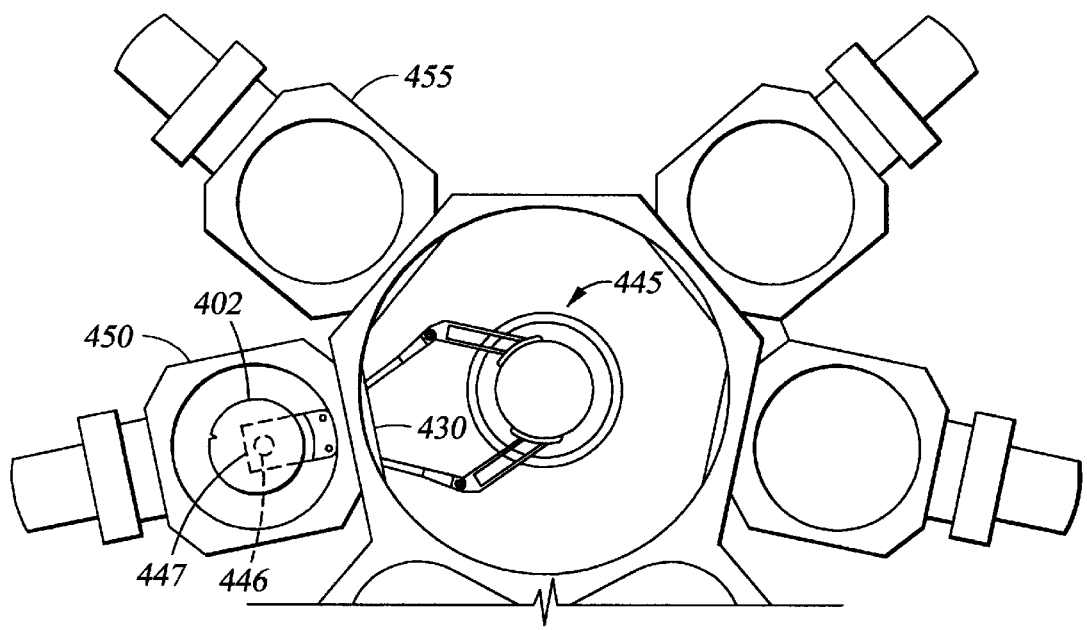
Figure 4D:
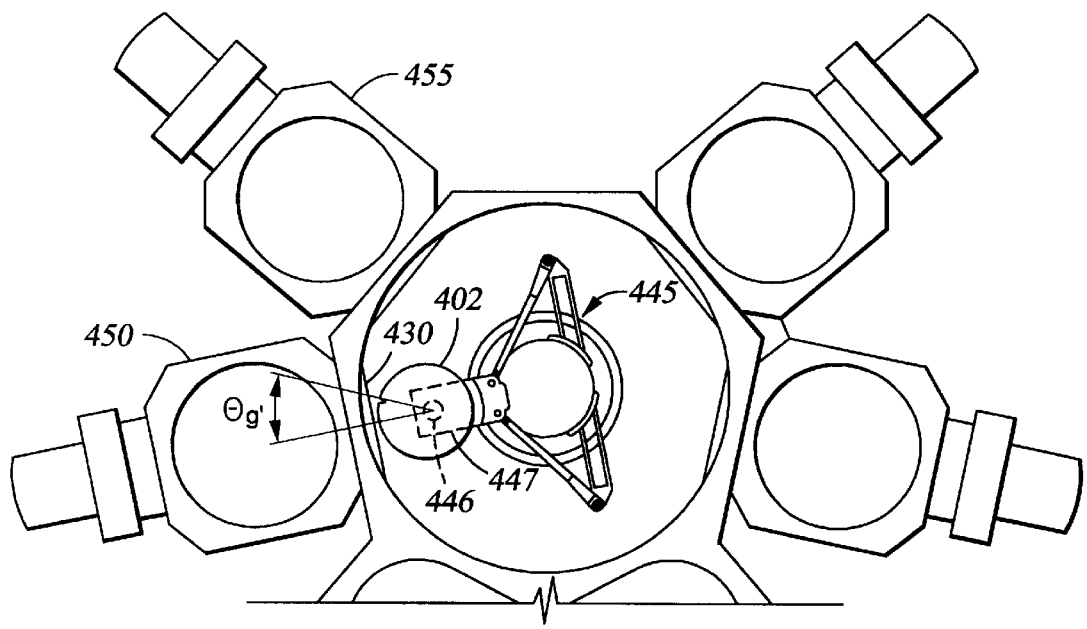

The robot 445 then extends to a position ($r_1$, $\theta_1$), as shown in FIG. 4C, which positions the rotatable gripper 446 below a central portion of the substrate 402 which ensures that the rotatable gripper 446 is able to securely grip the substrate 402 during transfers. Typically, a substrate lift system in the processing chamber lifts the substrate to a substrate transfer position which facilitates positioning of the substrate 402 onto the rotatable gripper 446. The vacuum mechanism of the gripper 446 is then activated to secure the substrate 402 during the transfer. The robot 445 then retracts out of the first processing chamber 445 with the substrate 402 secured on the gripper 446. The robot 445 typically retracts fully without varying the rotational position, i.e., the robot retracts to position ($r_0$, $\theta_1$), as shown in FIG. 4D.

As the robot 445 retracts, a sensor 430 (e.g., emitter and receiver disposed adjacent a slit opening on the chamber) detects the outline of the substrate 402 and transmit signals to the processor/controller of the system. The processor/controller receives the signals and calculates the position of the substrate 402, including the center point and the orientation indicator, in relation to a reference point. In one embodiment, the initial point ($r_0$, $\theta_0$) is selected as the reference point to simplify calculations for transfer between various chambers. Alternatively, the reference point is selected as the fully retracted position of the robot after the substrate has been transferred out of a chamber, for example in this case, ($r_0$, $\theta_1$). Once the position of the substrate, including the center point and the orientation indicator, is known with respect to a reference point, the processor/controller calculates the robot movements required to position the substrate with the substrate center and the orientation indicator aligned in the desired position in the second processing chamber 455. The calculation of the robot movements is performed using the inverse kinematic equations method described above.

Figure 4E:
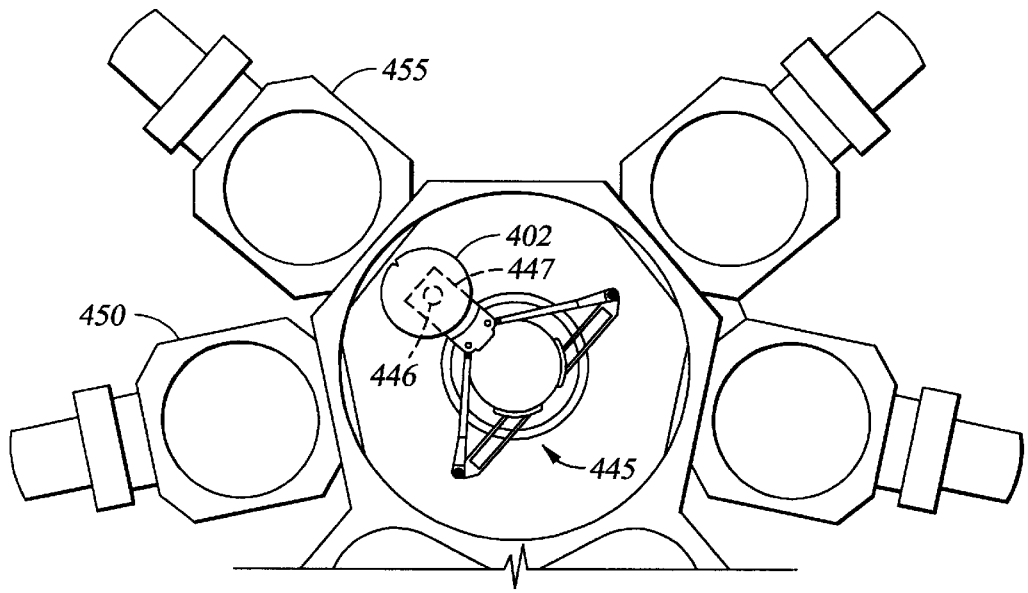
Figure 4F:
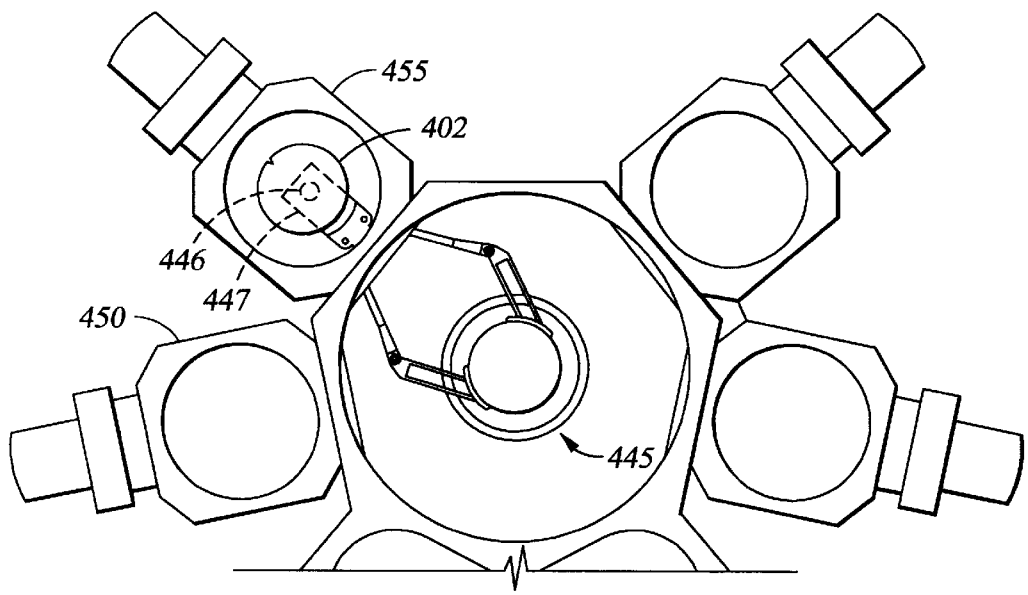

The robot 445 may first rotate the substrate 402 to the desired orientation and then compensate for the change in the center point position due to the rotation. As shown in FIG. 4D, the rotatable gripper 446 rotates the substrate 402 $\theta_{g'}$ degrees corresponding to the angular change required to position orientation indicator on the substrate 402 in the desired orientation. Because the position of the center point of the substrate changes after the substrate is rotated by the rotatable gripper (unless the center point of the gripper is aligned with the center point of the substrate), the movement of the robot is compensated accordingly. The robot 445 then rotates $\theta_2$ degrees, as shown in FIG. 4E, and extends a distance $r_2$, with robot at position ($r_2$, $\theta_2$), as shown in FIG. 4F, to position the center point of the substrate 402 at the desired destination position of the substrate with the correct orientation in the processing chamber. At this destination position, the vacuum mechanism of the gripper 446 is deactivated, and the substrate 402 may be lifted off the robot end effector 447. The robot 445 retracts fully out of the processing chamber to ($r_0$, $\theta_2$), and the substrate 402 is ready to be placed onto a substrate support and be processed in the second processing chamber 455. The robot 445 can be rotated to another position to begin another sequence of substrate transfer.

An alternative embodiment of the substrate transfer sequence positions the substrate in the destination position and then orients the substrate to the desired orientation. The transfer sequence is the same as above to calculate the position of the substrate, including the center point and the orientation indicator. However, in this embodiment, the robot first rotates $\theta_{2'}$ degrees and extends a distance $r_{2'}$ to position the center point at the desired destination position of the substrate in the processing chamber. The substrate is then lifted off the robot end effector by the wafer lift system in the chamber, and the robot moves to align the center of the rotatable gripper with the center point of the substrate. The substrate is then lowered onto the rotatable gripper, which then rotates the substrate to position the substrate in the correct orientation. The vacuum mechanism of the gripper is deactivated, and the substrate is lifted off the robot end effector. The robot retracts fully out of the processing chamber, and the substrate is ready to be placed onto a substrate support and be processed in the chamber. The robot can be rotated to another position to begin another sequence of substrate transfer.

The inventors also contemplate application of the invention using other robot configurations, including, for example, a three-arm robot without an rotatable gripper as the end effector disposed on the distal end of the third arm. However, in some instances, more complicated schemes of robot movement may be required to overcome interference problems with the physical constraints of the processing system.

While the foregoing is directed to the preferred embodiment of the present invention, other and further embodiments of the invention may be devised without departing from the basis scope thereof, and the scope thereof is determined by the claims that follow.

What is claimed is:

1. An apparatus for positioning a substrate, comprising:
 a) a robot having an en d effector adapted to transfer the substrate;
 b) one or more emitters disposed to emit a sensor beam in a plane intersecting a path of a substrate being transferred by the robot;

c) one or more receivers disposed to receive the sensor beam and to generate signals to a processor;

d) a processor adapted to process signals from the one or more receivers to determine a central point and an orientation indicator of the substrate relative to a reference point; and e) a controller for controlling robot movement according to the center point and the orientation indicator of the substrate.

2. The apparatus of claim 1 wherein the robot comprises a frog-leg type robot having a rotatable gripper disposed on the end effector.

3. The apparatus of claim 1 wherein the robot comprises a multi-link robot.

4. The apparatus of claim 1 wherein the robot further comprises a rotatable gripper disposed on the robot end effector.

5. A method for positioning a substrate, comprising:

a) transferring a substrate along a path intersecting a plane of a sensor beam;

b) determining a center point and an orientation indicator of the substrate utilizing signals from the sensor beam; and c) positioning a substrate according to the center point and the orientation indicator of the substrate.

6. The method of claim 5 wherein the center point of the substrate is determined by minimizing an error function of a set of data points corresponding to a perimeter of the substrate.

7. The method of claim 5 wherein the orientation indicator is determined by comparing a set of data points that exceeds a range of radius deviation values to a set of stored data for an orientation indicator.

8. The method of claim 5 wherein the step of positioning the substrate comprises aligning the center point and the orientation indicator of the substrate with a destination position.

9. The method of claim 5 wherein the step of positioning the substrate comprises:

i) rotating the substrate to a desired orientation on an end effector of a robot;

ii) rotating the robot to position the substrate for insertion into a chamber; and iii) extending the robot to align the center point of the substrate with a destination position in the chamber.

10. The method of claim 5 wherein the step of positioning the substrate comprises:

i) rotating a robot to position the substrate for insertion into a chamber;

ii) extend the robot to align the center point of the substrate with a destination position in the chamber;

iii) lifting the substrate off the robot;

iv) positioning a rotatable robot end effector aligned with the center point of the substrate;

v) lowering the substrate onto the rotatable robot end effector; and vi) rotating the substrate to a desired orientation.

* * * * *

UNITED STATES PATENT AND TRADEMARK OFFICE
CERTIFICATE OF CORRECTION

PATENT NO. : 6,327,517 B1
DATED : December 4, 2001
INVENTOR(S) : Sundar

Page 1 of 1

It is certified that error appears in the above-identified patent and that said Letters Patent is hereby corrected as shown below:

Title page,
OTHER PUBLICATIONS, please replace " pp. 13061311" with -- pp. 1306-1311 --.

Column 7,
Line 52, please delete "(" after -- ($\theta_{1b}$, --.

Column 9,
Line 1, please delete "the" after -- is --.

Column 10,
Line 50, please replace "without an" with -- without a --.
Line 63, please replace "en d" with -- end --.

Signed and Sealed this

Twenty-first Day of May, 2002

Attest:

Attesting Officer

JAMES E. ROGAN
Director of the United States Patent and Trademark Office